(12) United States Patent
Liu et al.

(10) Patent No.: US 12,426,452 B2
(45) Date of Patent: Sep. 23, 2025

(54) DISPLAY SUBSTRATE AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Qi Liu, Beijing (CN); Wanli Chen, Beijing (CN); Xiangdan Dong, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/814,935

(22) Filed: Aug. 26, 2024

(65) Prior Publication Data
US 2024/0423034 A1    Dec. 19, 2024

Related U.S. Application Data

(63) Continuation of application No. 17/434,946, filed as application No. PCT/CN2020/136451 on Dec. 15, 2020, now Pat. No. 12,101,972.

(51) Int. Cl.
*G09G 3/3233* (2016.01)
*G09G 3/32* (2016.01)
*H10K 59/126* (2023.01)
*H10K 59/131* (2023.01)

(52) U.S. Cl.
CPC ............. *H10K 59/126* (2023.02); *G09G 3/32* (2013.01); *H10K 59/131* (2023.02); *G09G 2300/0426* (2013.01); *G09G 2300/0819* (2013.01); *G09G 2300/0842* (2013.01); *G09G 2300/0861* (2013.01)

(58) Field of Classification Search
None
See application file for complete search history.

(56) References Cited

U.S. PATENT DOCUMENTS

2019/0302940 A1* 10/2019 Nie ..................... H10D 30/6723
2021/0376026 A1* 12/2021 Mou ..................... G09G 3/2003

* cited by examiner

*Primary Examiner* — Carl Adams
(74) *Attorney, Agent, or Firm* — Muncy, Geissler, Olds & Lowe, P.C.

(57) ABSTRACT

A display substrate includes a base substrate and a drive circuit layer, a light-emitting layer, and a touch control layer arranged on the base substrate. The first reset transistor is at least partially covered by a first light shielding structure in a direction away from the base substrate. The first light shielding structure includes a power signal line. And the first reset transistor is at least partially covered by a second light shielding structure in a direction away from the base substrate. The second light shielding structure includes an anode of the light-emitting layer or a metal line of the touch control layer.

20 Claims, 13 Drawing Sheets

DISPLAY SUBSTRATE AND DISPLAY DEVICE

CROSS-REFERENCE TO RELATED APPLICATION

The present application is a continuation application of U.S. application Ser. No. 17/434,946 filed on Aug. 30, 2021, which is the U.S. national phase of PCT Application No. PCT/CN2020/136451 filed on Dec. 15, 2020, both of which are incorporated herein by reference in their entity.

TECHNICAL FIELD

The present disclosure relates to the technical field of display, and particularly to a display substrate and a display device.

BACKGROUND

In the drive process of a display substrate, it is usually required to set a thin film transistor (TFT) to control the transmission of signals, and an active layer of the TFT includes a semiconductor material, and the semiconductor material is relatively sensitive to light.

SUMMARY

In one aspect, embodiments of the present disclosure provide a display substrate including a base substrate and a driver circuit layer, a light-emitting layer and a touch layer arranged on the base substrate; the drive circuit layer includes at least a drive transistor, a first reset transistor, a compensation control transistor, a reset control line, an initialization signal line, a switch control line, a light-emitting control signal line, a data signal line, and a power signal line; the drive transistor, the first reset transistor, and the compensation control transistor all include a control terminal, a first electrode, and a second electrode; the light-emitting layer includes a light-emitting element corresponding to each sub-pixel; wherein the first electrode of the drive transistor is electrically connected to the power signal line, and the second electrode thereof is coupled to the corresponding light-emitting element; the control terminal of the first reset transistor is connected to the reset control line, the first electrode thereof is coupled to the initialization signal line, and the second electrode thereof is coupled to the control terminal of the drive transistor; the control terminal of the compensation control transistor is coupled to the switch control line, the first electrode thereof is coupled to a second electrode of the drive transistor, and the second electrode thereof is coupled to the control terminal of the drive transistor; the first reset transistor is at least partially covered by a first light shielding structure in a direction away from the base substrate, the first light shielding structure comprises the power signal line; and the first reset transistor is at least partially covered by a second light shielding structure in a direction away from the base substrate, the second light shielding structure comprises an anode of the light-emitting layer or a metal line of the touch control layer. Optionally, the first light shielding structure shields the second electrode of the first reset transistor.

Optionally, the second light shielding structure shields the first electrode of the first reset transistor.

Optionally, the display substrate includes green sub-pixels, the orthogonal projection of the first reset transistor on the base substrate overlaps the orthogonal projection of the green sub-pixels on the base substrate, and the second light shielding structure is an anode of the green sub-pixels.

Optionally, the display substrate includes the green sub-pixel, the orthogonal projection of the first reset transistor on the base substrate is located between the orthogonal projections of two adjacent green sub-pixels on the base substrate, and the second shading structure is the metal line of the touch control layer.

Optionally, a width of the metal line of the touch control layer is greater in a portion between the two adjacent green sub-pixels than in a portion other than between the two adjacent green sub-pixels.

Optionally, an active layer of the first reset transistor comprises first and second semiconductor portions spaced apart, and first conductor portions coupled to the first and second semiconductor portions, respectively, and the first conductor portions are covered by a third light shielding structure, and the third light shielding structure comprise at least one of the reset control line and the initialization signal line.

Optionally, the drive circuit layer includes an active layer, a first gate metal layer, a second gate metal layer, and a first source and drain metal layer, and the power supply signal line is located on the first source and drain metal layer; and at least a portion of the first conductor portions are shielded by the power signal line in a direction away from the base substrate.

Optionally, the driver circuit layer further includes a second source-drain metal layer; and the first reset transistor is at least partially covered by the second source-drain metal layer in a direction away from the base substrate.

Optionally, the second source-drain metal layer includes a power compensation signal line which has a shielding area corresponding to the first reset transistor, and at least part of the first reset transistor is covered by the reset control line in a direction away from the substrate.

Optionally, the active layer of the compensation control transistor includes third and fourth semiconductor portions spaced apart second conductor portions coupled to the third and fourth semiconductor portions, respectively; and the second conductor portion is covered by the second light shielding structure in a direction away from the base substrate.

Optionally, a shielding structure is further included, wherein the drive circuit layer includes an active layer, a first gate metal layer, a second gate metal layer, and a first source and drain metal layer, and the shielding structure is located on the second gate metal layer; and the second conductor portion is covered by the shielding structure in a direction away from the base substrate.

Optionally, the display substrate includes a red sub-pixel, the second light shielding structure includes an anode of the red sub-pixel, the anode of the red sub-pixel has a rounded rectangle, the red sub-pixel includes a target red sub-pixel, the anode of the target red sub-pixel further comprises a protrusion in a direction away from the base substrate, and the protrusion covers one of the compensation control transistors.

Optionally, there is an overlap between the area of the first reset transistor covered by the first light shielding structure and the area covered by the second light shielding structure.

Optionally, there is no overlap between the area of the first reset transistor covered by the first light shielding structure and the area covered by the second light shielding structure.

Based on the above-mentioned technical solution of the display panel, a second aspect of the present disclosure provides a display device comprising the display substrate described in any one of the above.

DETAILED DESCRIPTION

The technical solutions of embodiments of the present disclosure will now be described more fully hereinafter with reference to the accompanying drawings, in which some, but not all embodiments of the disclosure are shown. All other embodiments obtained by those of ordinary skill in the art on the basis of the embodiments in the application without creative work shall fall within the scope of protection of the application.

The embodiments of the present disclosure provide a display substrate including a base substrate and a driver circuit layer located on the base substrate.

Figure 1:
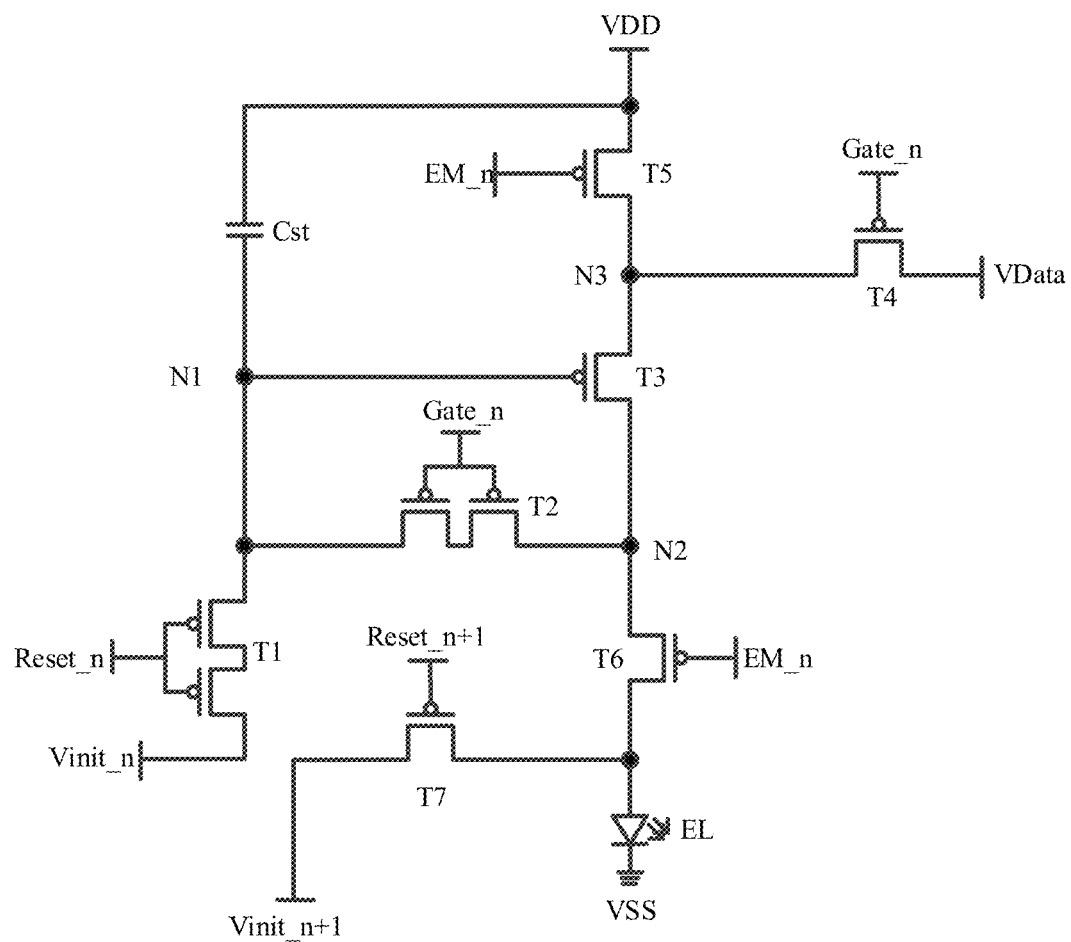
FIG. 1 is a circuit diagram illustrating a pixel drive circuit for a sub-pixel according to an embodiment of the present disclosure.

As shown in FIG. 1, which is a circuit diagram illustrating a pixel drive circuit in one embodiment of the present disclosure, wherein the pixel drive circuit is specifically a 7T1C pixel drive circuit, the drive circuit of each sub-pixel includes a total of seven thin film transistors (TFTs) T1 to T7, a storage capacitor Cst, and a light-emitting element EL.

T1 to T7 shown in FIG. 1 are respectively seven TFTs, each TFT includes a control terminal, a first electrode, and a second electrode, wherein the control terminal of the TFT can be a gate electrode of the TFT, and the first electrode and the second electrode of the TFT are respectively a source electrode and a drain electrode, or respectively a drain electrode and a source electrode.

In some embodiments, the drive circuit layer further includes a reset control line Reset_n, an initialization signal line Vint_n, a switch control lineGate_n, a light-emitting control signal line EM_n, a data signal line VData, and a power signal line VDD.

Figure 2:
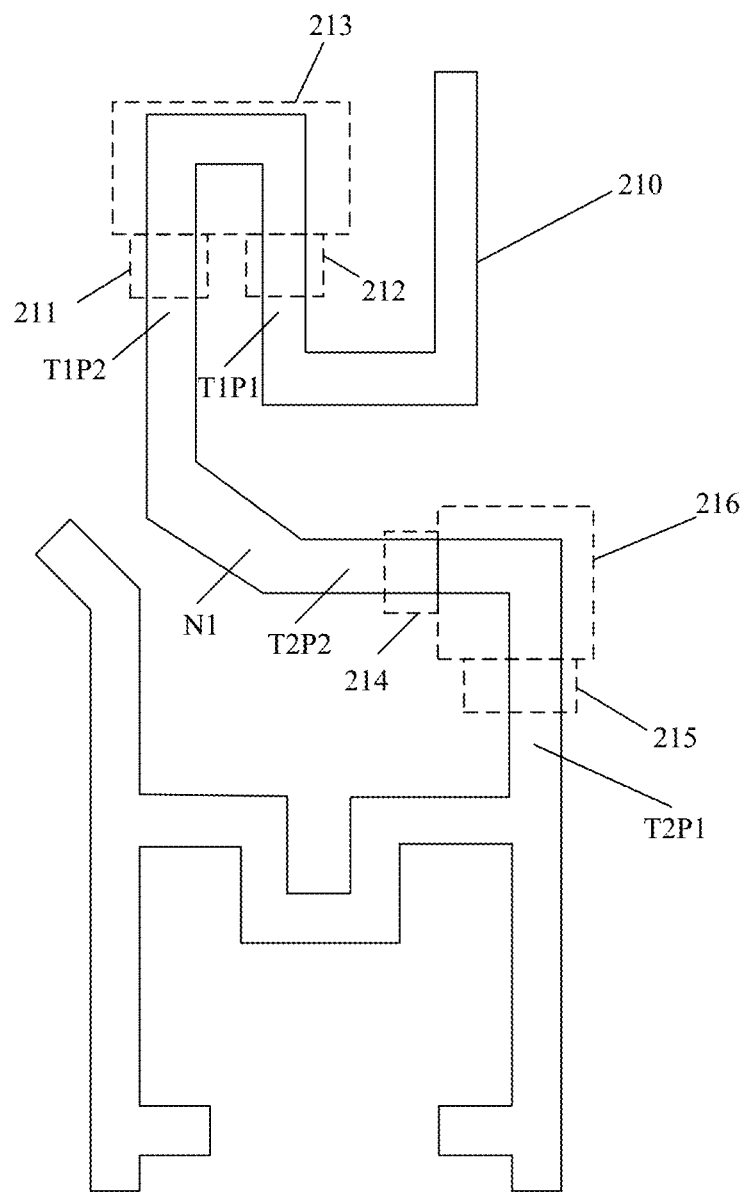
FIG. 2 is a schematic structural diagram illustrating an active layer in at least one embodiment of the present disclosure.
Figure 3:
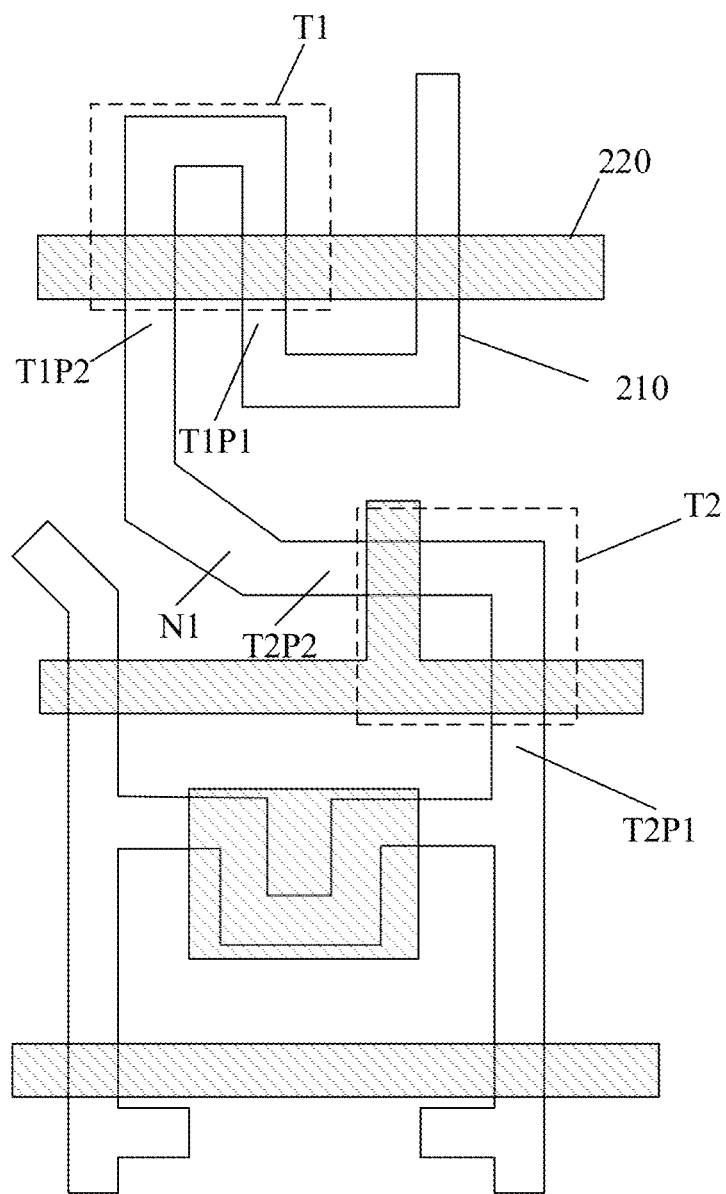
FIG. 3 is a schematic structural diagram illustrating a display substrate in at least one embodiment of the present disclosure.
Figure 4:
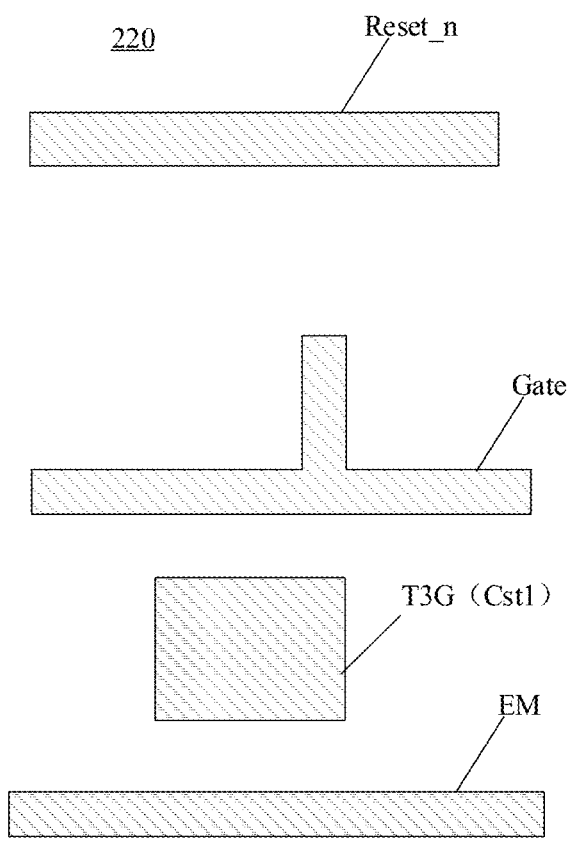
FIG. 4 is a schematic structural diagram illustrating a first gate metal layer structure of FIG. 3.

As shown in FIG. 1, in one embodiment, the pixel drive circuit of each sub-pixel specifically includes: a first reset transistor T1, wherein the control terminal of the first reset transistor T1 is coupled to a reset control line Reset_n with reference to FIG. 1 to FIG. 4, a first electrode T1P1 of the first reset transistor T1 is coupled to the initialization signal line Vint_n, and a second electrode T1P2 of the first reset transistor T1 is coupled to a first node N1; a compensation control transistor T2, with reference to FIG. 1 to FIG. 4, the control terminal of the compensation control transistor T2 is coupled to the switch control line Gate n. As shown in FIG. 1, FIG. 3, and FIG. 4, a first electrode T2P1 of the compensation control transistor T2 is coupled to a second node N2, and a second electrode T2P2 of the compensation control transistor T2 is coupled to the first node N1; a drive transistor T3, a control terminal of the drive transistor T3 is coupled to a first node N1, a first electrode of the drive transistor T3 is coupled to a third node N3, and a second electrode of the drive transistor T3 is coupled to a second node N2; a switching transistor T4, the control terminal of the switching transistor T4 is coupled to a switching control line Gate_n, a first electrode S4 of the switching transistor T4 is coupled to a data signal line VData, and a second electrode D4 of the switching transistor T4 is coupled to a third node N3; a first light-emitting control transistor T5, wherein the control terminal of the first light-emitting control transistor T5 is coupled to a light-emitting control signal line EM_n, the first electrode of the first light-emitting control transistor T5 is coupled to the power supply signal line VDD, and the second electrode of the first light-emitting control transistor T5 is coupled to a third node N3; a second light-emitting control transistor T6, wherein the control terminal of the second light-emitting control transistor T6 is coupled to a light-emitting control signal line EM_n, the first electrode of the second light-emitting control transistor T6 is coupled to the second node N2, and the second electrode of the second light-emitting control transistor T6 is coupled to the anode of a corresponding light-emitting element EL; and a second reset transistor T7, wherein the control terminal of the second reset transistor T7 is coupled to a reset control line Reset_n+1 in an immediately next row of sub-pixels, the second electrode of the second reset transistor T7 is coupled to the anode of the corresponding light-emitting element EL, and the first electrode of the second reset transistor T7 is coupled to an initialization signal line Vint_n+1 in the immediately next row of sub-pixels.

It should be noted that in the present embodiment, the current row of sub-pixels is exemplified as one sub-pixel in the nth row of the display panel, and thus the reset control line Reset_n and the initialization signal line Vint_n refer to the reset control line and the initialization signal line corresponding to the nth row of sub-pixels, respectively. Accordingly, the reset control line and the initialization signal line corresponding to the previous row of sub-pixels adjacent to the current row, i.e. the (n−1)th row of sub-pixels, are respectively the reset control line Reset_n−1 and the initialization signal line Vint_n−1. And the next row of sub-pixels adjacent to the current row is the (n+1)th row of sub-pixels, and the reset control line and the initialization signal line corresponding to the (n+1)th row of sub-pixels are the reset control line Reset n+1 and the initialization signal line Vint_n+1, respectively.

Figure 5:
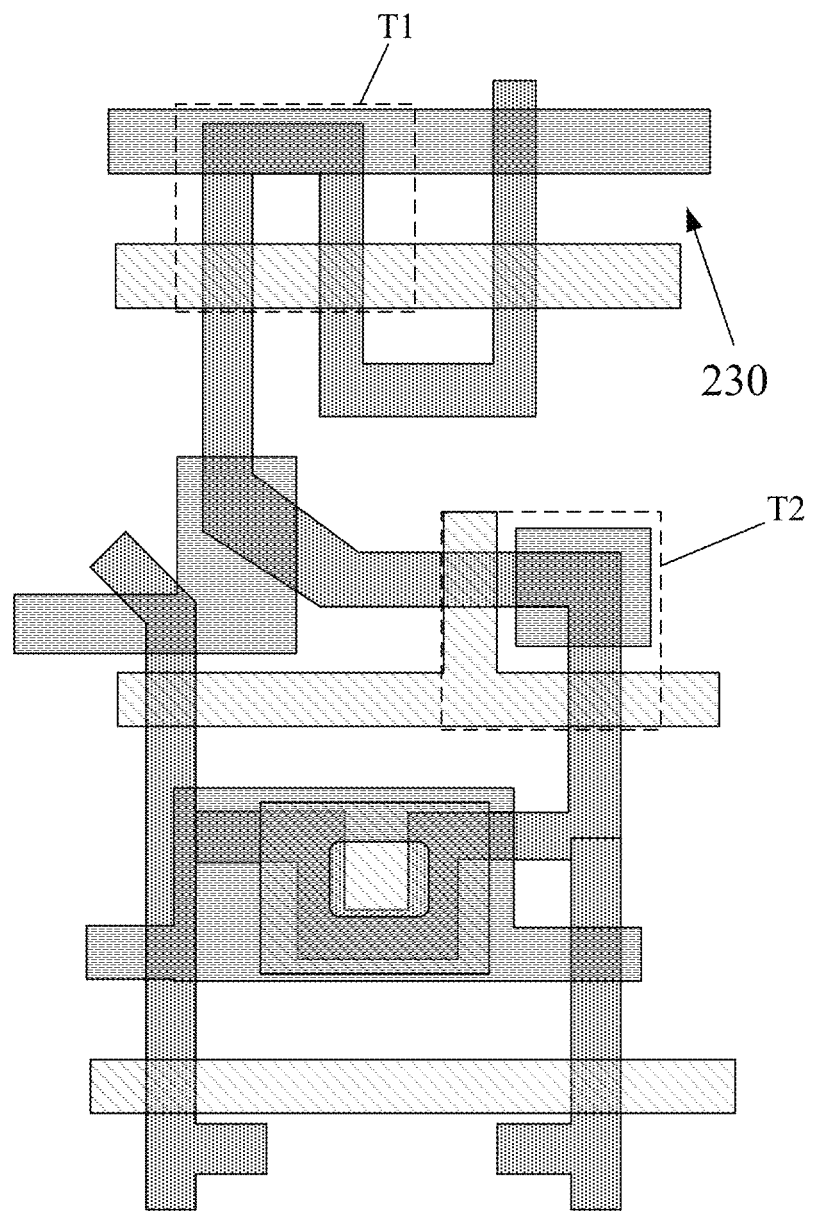
FIG. 5 is a schematic structural diagram illustrating a display substrate in at least one embodiment of the present disclosure.
Figure 6:
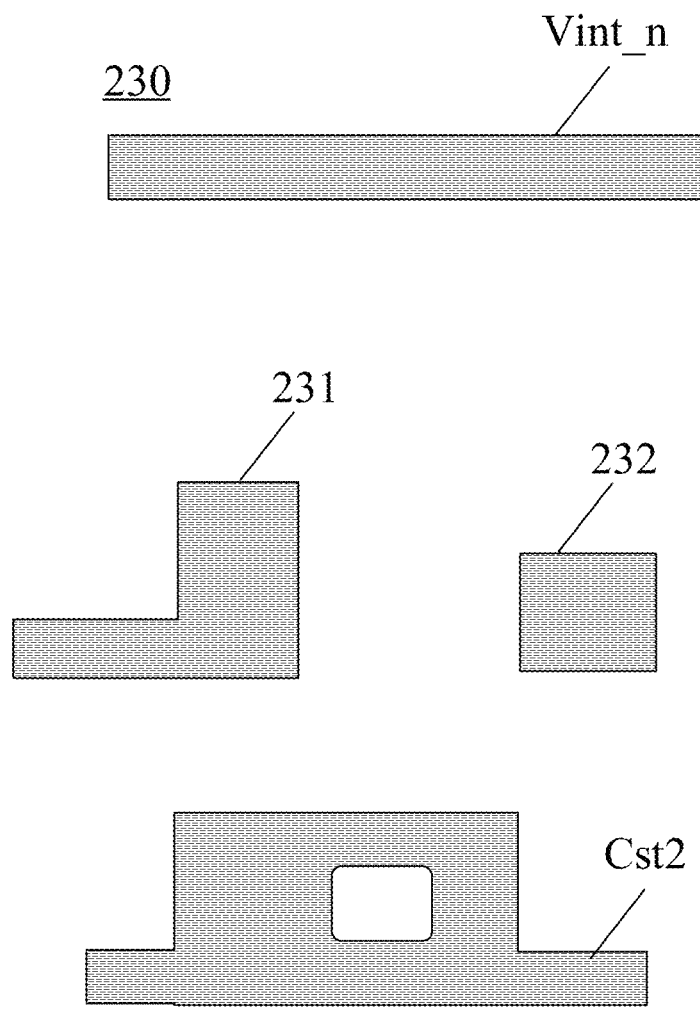
FIG. 6 is a schematic structural diagram illustrating a second gate metal layer of FIG. 5.

As shown in FIG. 4, in an optional embodiment, a first plate Cst1 of a storage capacitor Cst is coupled to the gate T3G of the drive transistor T3, and therefore, the gate T3G of the drive transistor T3 can also be multiplexed as the first plate Cst1 of the storage capacitor Cst. And as shown in FIG. 5 and FIG. 6, a second plate Cst2 of the storage capacitor Cst is graphically coupled to the power signal line VDD, wherein the gate T3G of the drive transistor T3 can also be referred to the control terminal of the drive transistor T3.

The cathode of the light-emitting element EL is coupled to a common power supply line VSS.

The first reset transistor is at least partially covered by a first light shielding structure in a direction away from the base substrate, wherein the first light shielding structure includes the power signal line VDD; and the first reset transistor T1 is at least partially covered by a second light shielding structure in a direction away from the base substrate, wherein the second light shielding structure includes the anode of the light-emitting element EL or the metal line 250 of the touch control layer.

In the present embodiment, the first reset transistor T1 is at least partially covered by the first shading structure and the second shading structure, and it can be understood that the orthogonal projection of the first reset transistor T1 on the base substrate overlaps the orthogonal projection of the first shading structure and the second shading structure on the base substrate, and the first shading structure and the second shading structure are both located on one side of the first reset transistor T1 away from the base substrate.

The first shading structure in the present embodiment includes the power supply signal line VDD, and the second shading structure includes the metal line 250 of the anode of the light-emitting layer or the touch control layer. In implementation, the position and structure of the power supply signal line VDD and the metal line of the anode of the light-emitting layer or the touch control layer are adjusted to shade the first reset transistor T1.

Thus, external light cannot directly irradiate the first reset transistor T1 due to being blocked by the first light shielding structure and the second light shielding structure, thereby reducing a possible influence of the external light on the performance of the first reset transistor T1 to improve the reliability of the display panel.

It should be understood that in this embodiment, the first light shielding structure and the second light shielding structure shielding the first reset transistor T1 can or cannot have an overlap area. In other words, the orthogonal projections of the first light shielding structure and the second light shielding structure shielding the first reset transistor T1 on the base substrate can or cannot overlap partially. In other words, the orthogonal projections of the first light shielding structure and the second light shielding structure may have no overlapped portion at all.

In some embodiments of the present disclosure, the display substrate includes a first gate metal layer 220, a second gate metal layer 230, and a first source-drain metal layer 240. In other embodiments of the present disclosure, the display substrate also includes a second source-drain metal layer 260.

As shown in FIG. 3 and FIG. 4, the first gate metal layer 220 is used to form gates of the transistors (for example, T1 to T7) in the drive circuit of the sub-pixels on the display substrate, and the display substrate includes a switch control line Gate, a light-emitting control signal line EM, and a reset control line (for example, Reset_n, Reset_n+1), etc.

As shown in FIG. 5 and FIG. 6, the second gate metal layer 230 is used to form the initialization signal lines (for example, Vint_n, Vint_n+1), the second plate Cst2 of the storage capacitor, etc., the first shielding structure 231, the second shielding structure 232, etc. it should be noted that the second shielding structure 232 of one sub-pixel located in the same row and the first shielding structure 231 of the next sub-pixel of the same row can be arranged separately or in an integral pattern.

The first source-drain metal layer 240 is used to form a data signal line VData, the power signal line VDD, and some conductive connections of the display substrate.

Figure 8:
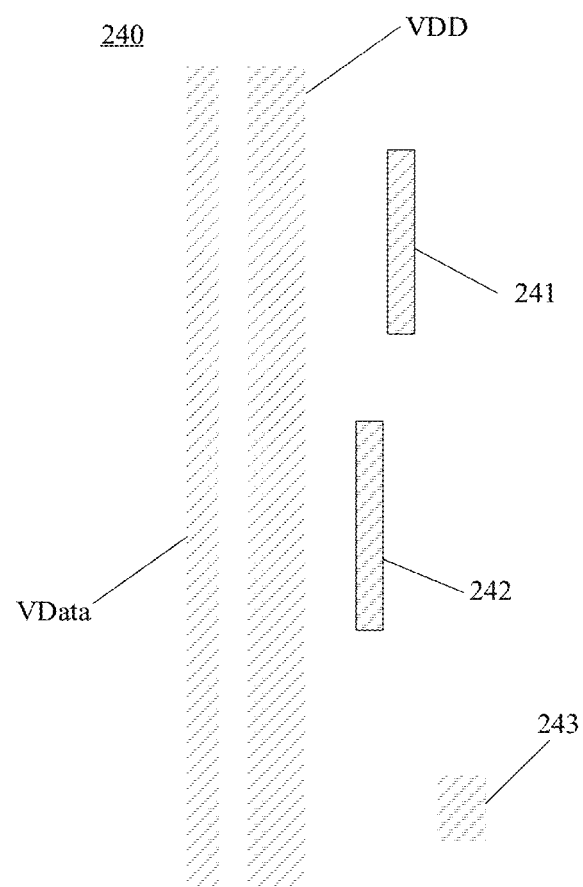
FIG. 8 is a schematic structural diagram illustrating a first source-drain metal layer of FIG. 7.

As shown in FIG. 8, in some embodiments, the conductive connections specifically include a first conductive connection 241, a second conductive connection 242, and a third conductive connection 243, wherein the first conductive connection 241 is connected to the initialization signal line Vint_n and the first electrode of the first reset transistor T1, respectively, the second conductive connection 242 is respectively connected to the second electrode of the compensation control transistor T2 and the control electrode of the drive transistor T3, and the third conductive connection 243 is respectively connected to the second electrode of the second light-emitting control transistor T6 and the anode of the light-emitting element EL.

Figure 15:
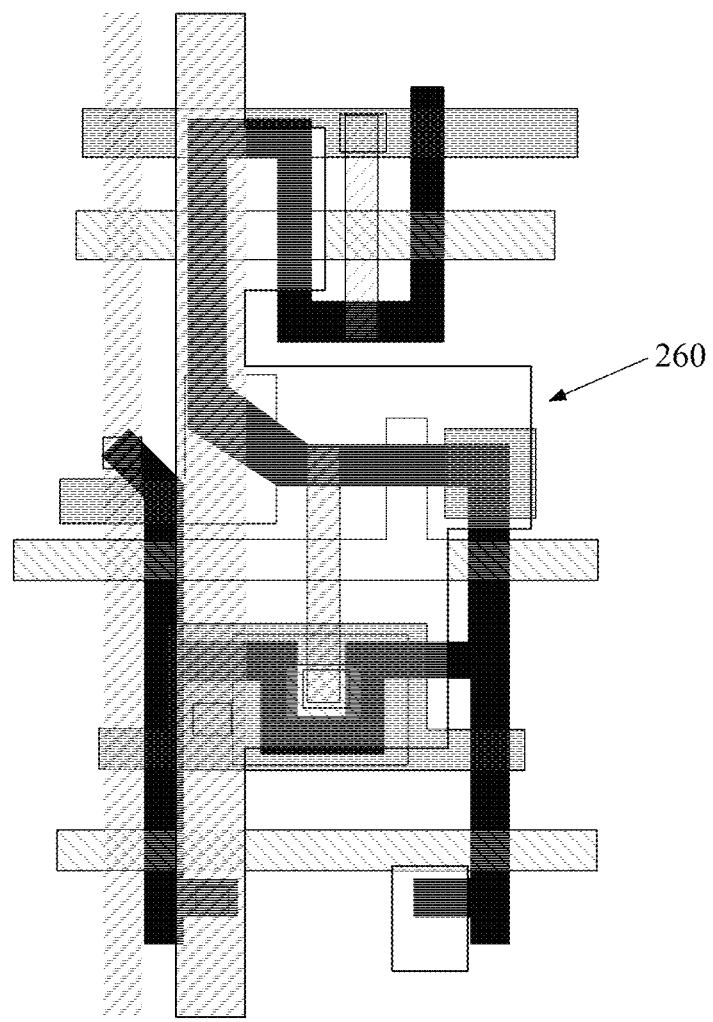
FIG. 15 is a schematic structural diagram illustrating a display substrate in at least one embodiment of the present disclosure.
Figure 16:
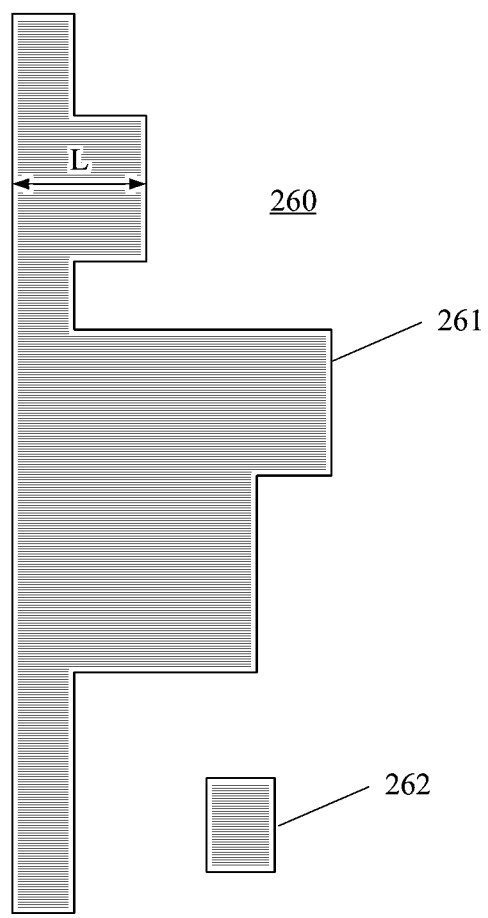
FIG. 16 is a schematic structural diagram illustrating a second source-drain metal layer of FIG. 15.

As shown in FIG. 15 and FIG. 16, in an optional embodiment, the display substrate further includes a second source-drain metal layer 260, which includes a power supply compensation signal line 261 and a transition structure 262.

In some embodiments of the present disclosure, the first light shielding structure shields the second electrode T1P2 of the first reset transistor T1.

The first light shielding structure in the present embodiment includes the power signal line VDD.

Figure 7:
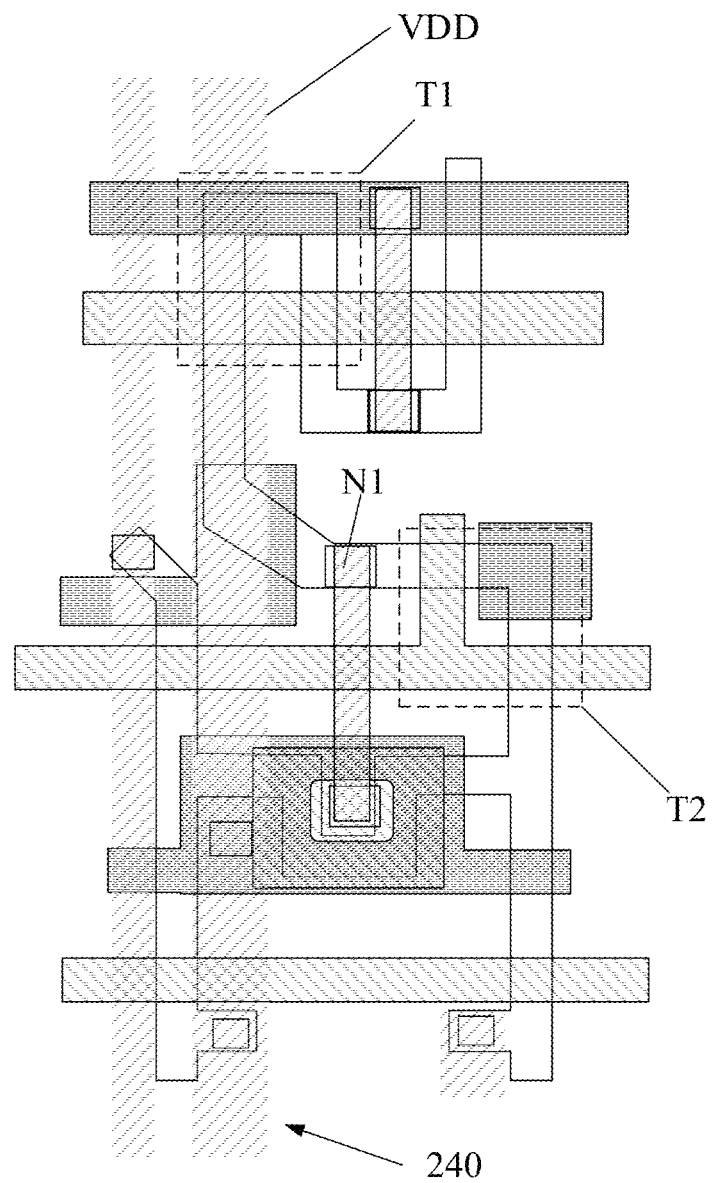
FIG. 7 is a schematic structural diagram illustrating a display substrate in at least one embodiment of the present disclosure.

Referring to FIG. 2, FIG. 3, and FIG. 7 together, the power signal line VDD blocks the second electrode T1P2 of the first reset transistor T1 so that light is directly irradiated to the second electrode T1P2 of the first reset transistor T1.

In some embodiments of the present disclosure, the second light shielding structure blocks the first electrode T1P1 of the first reset transistor T1.

Figure 9:
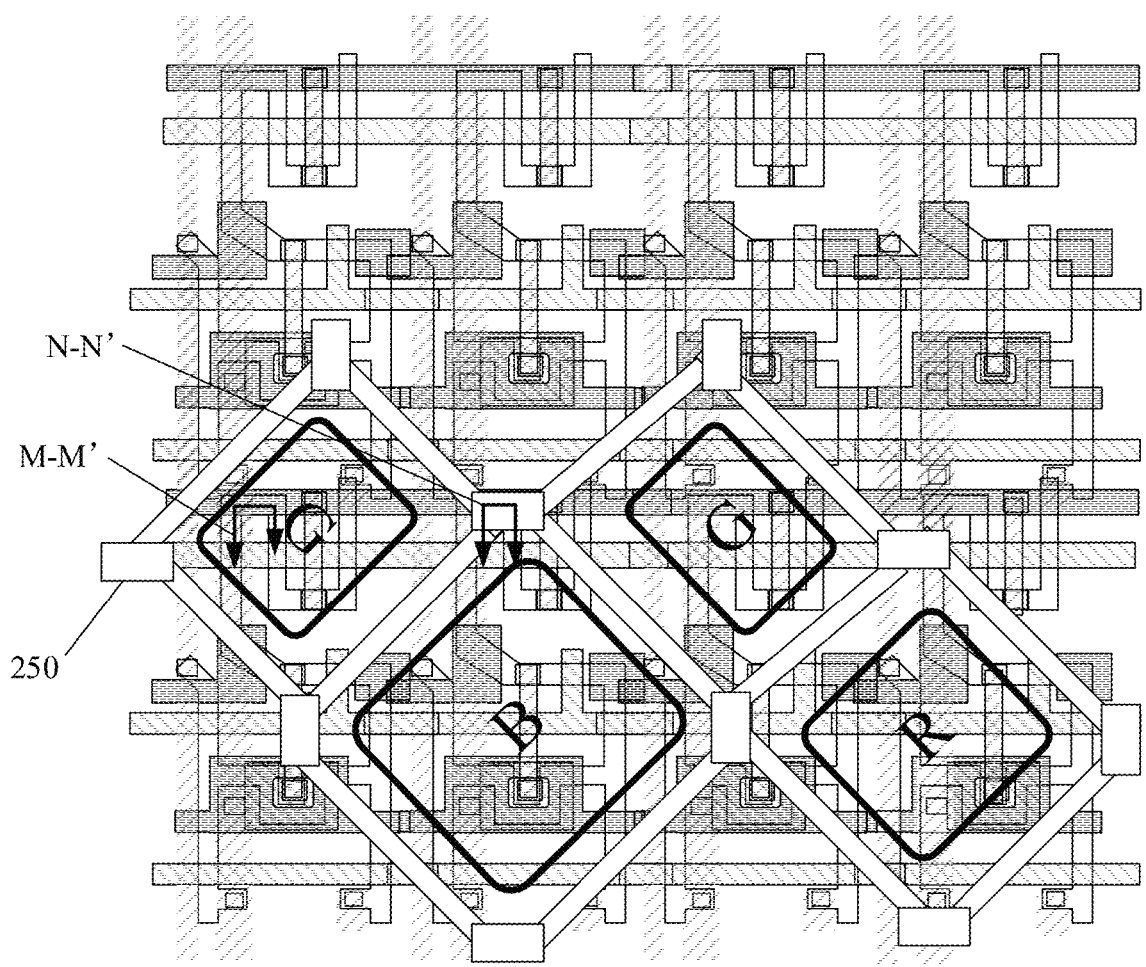
FIG. 9 is a schematic structural diagram illustrating a display substrate in at least one embodiment of the present disclosure.
Figure 10:
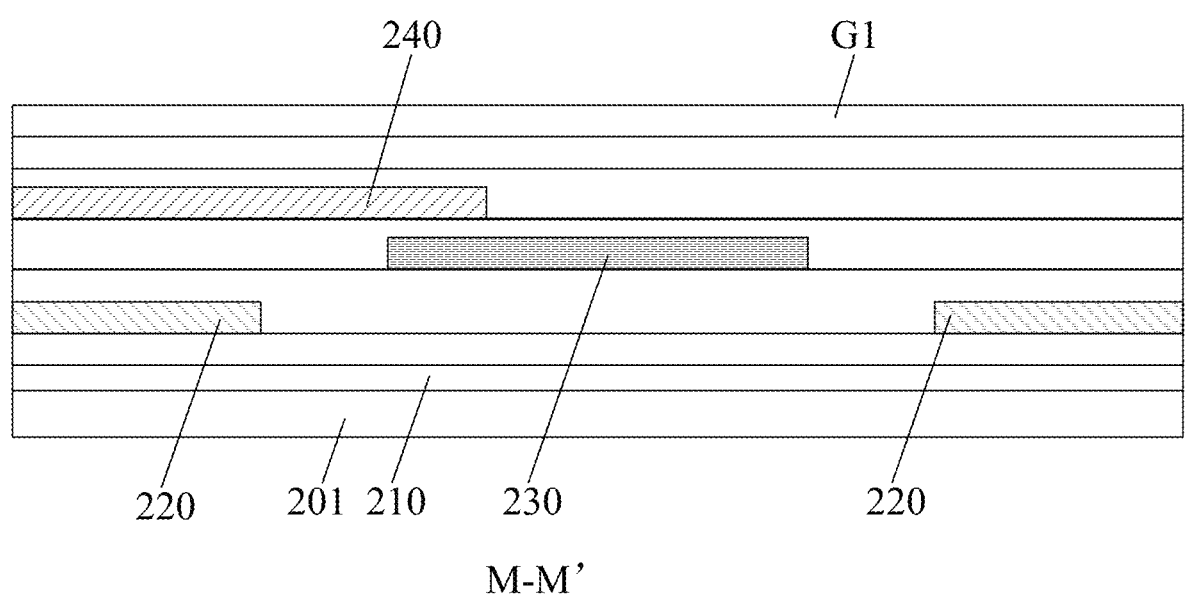
FIG. 10 is a sectional view along line M-M' of FIG. 9.

As shown in FIG. 9 and FIG. 10, in some embodiments of the present disclosure, the orthogonal projection of the first reset transistor T1 on the base substrate 201 overlaps the orthogonal projection of the anode G1 of the green sub-pixel G on the base substrate 201.

The second light shielding structure in the present embodiment can be the anode G1 of the green sub-pixel G, as shown in FIG. 9 and FIG. 10, the orthogonal projection of a part of the first reset transistor on the base substrate 201 overlaps the orthogonal projection of the green sub-pixel G on the base substrate 201, such that these first reset transistors T1 can be shielded by the anode of the green sub-pixel G, in particular, the first electrode T1P1, the second electrode T1P2, and the channel area of the first reset transistors T1 can be shielded.

In some embodiments of the present disclosure, the orthogonal projection of the first reset transistor T1 on the base substrate 201 is located between the orthogonal projections of two adjacent green sub-pixels G on the base substrate 201. The second light shielding structure in the present embodiment can be the metal line 250 including the anode of the light-emitting layer or the touch control layer.

In some alternative embodiments, the second light shielding structure is the metal line 250 of the touch layer.

Figure 11:
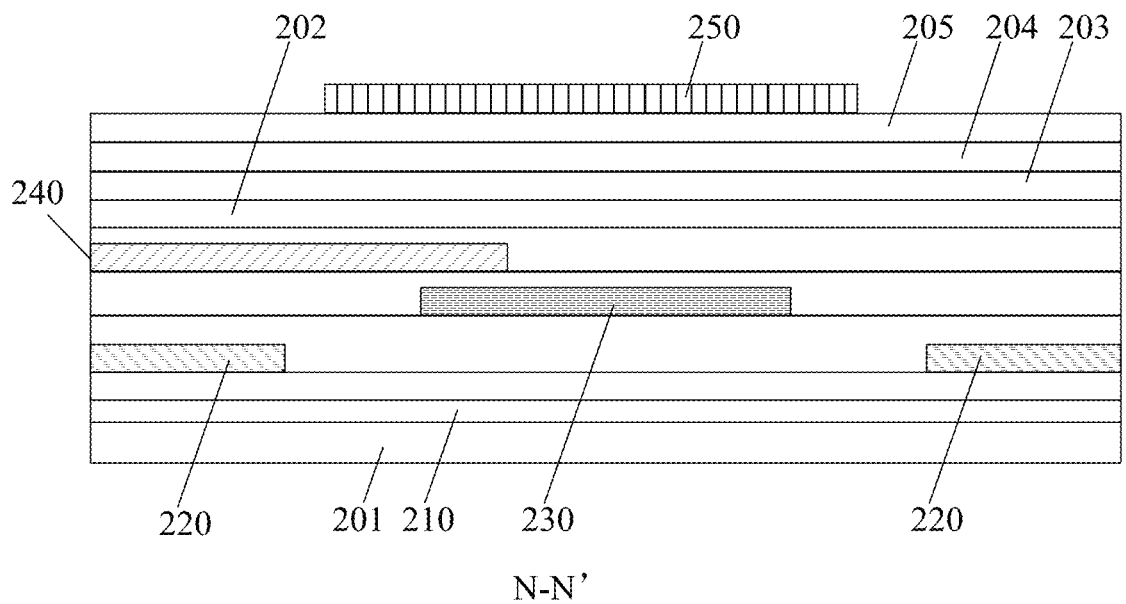
FIG. 11 is a cross-sectional view along line N-N' of FIG. 9.
Figure 12:
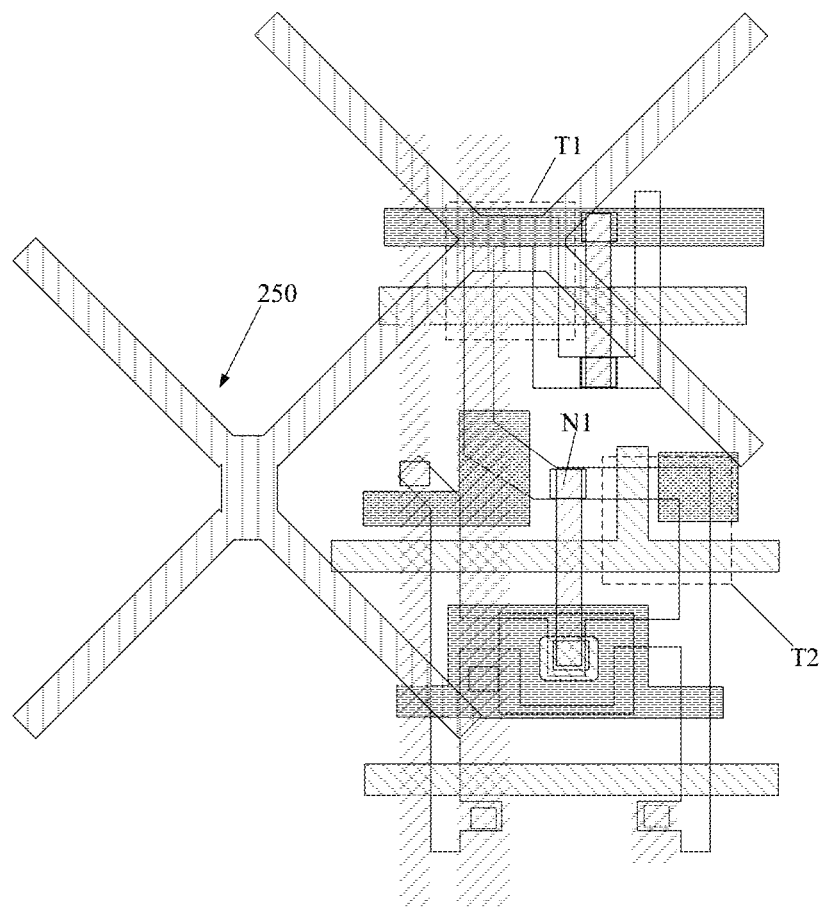
FIG. 12 is a schematic structural diagram illustrating a display substrate in at least one embodiment of the present disclosure.

As shown in FIG. 9, FIG. 11 and FIG. 12, the orthogonal projection of a part of the first reset transistors T1 on the base substrate 201 is located between two adjacent green sub-pixels G in a first direction (lateral in FIG. 9), in which these first reset transistors T1 are shielded by using the metal line 250 of the touch layer, in particular, the first electrode T1P1, the second electrode T1P2, and the channel area of the first reset transistors can be shielded.

As shown in FIG. 11, one side of the drive circuit layer away from the base substrate 201 can also require the manufacturing structures such as a planar layer 202, a pixel definition layer 203, an encapsulation layer 204, and an inorganic insulating layer 205. Furthermore, the metal line 250 of the touch control layer can be manufactured on one side of the inorganic insulating layer 205 away from the base substrate 201.

The metal line 250 of the touch control layer is specifically made using a metal mesh process, and the formed touch control layer includes a receiving electrode and a transmitting electrode which are intersected and insulated.

Figure 13:
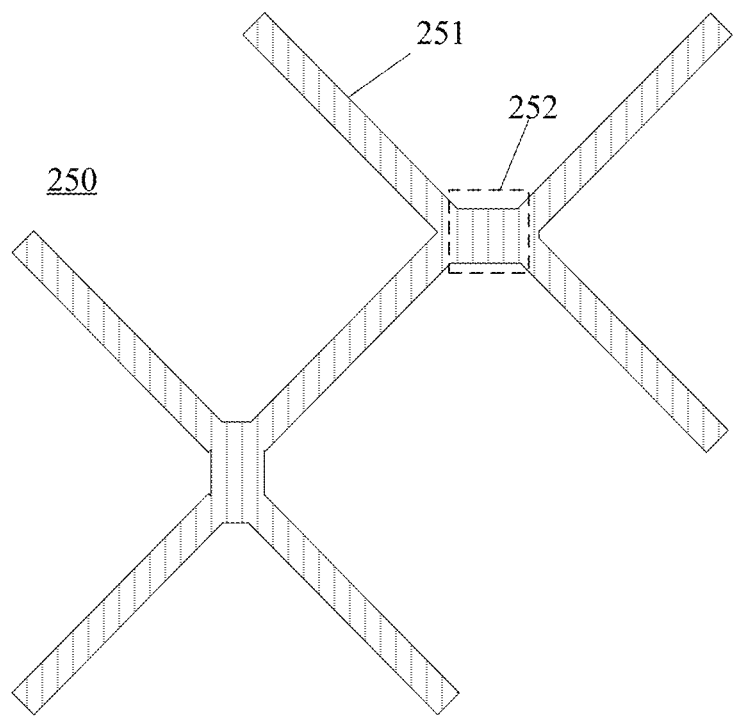
FIG. 13 is a schematic structural diagram illustrating a metal line of the touch layer of FIG. 12.

As shown in FIG. 13, the metal line 250 includes a line structure 251 and a bridge structure 252, a plurality of the line structures 251 are coupled at the bridge structure 252, and a shielding effect for the first reset transistor T1 can be improved by arranging the bridge structure 252 with a certain area.

In some embodiments of the present disclosure, the width of the metal line 250 of the touch layer is greater in a portion between the two adjacent green sub-pixels G than in a portion other than between the two adjacent green sub-pixels G.

In the present embodiment, the width of the metal line 250 is further adjusted so that the width of the portion of the metal line 250 corresponding to the first reset transistor T1 is greater than the width of other portions of the metal line 250, thereby further improving the shielding effect for the first reset transistor T1.

In some embodiments of the present disclosure, the second light shielding structure is also used to cover the active layer 210 of the compensation control transistor T2.

As shown in FIG. 2, the active layer of the compensation control transistor T2 includes a third and a fourth semiconductor portions 214 and 215 spaced apart, and a second conductor portion 216 coupled to the third and the fourth semiconductor portions 214 and 215, respectively, and the second conductor portion 216 is covered by the second light shielding structure.

In some embodiments, the display substrate includes a red sub-pixel R and a blue sub-pixel B, and the second light shielding structure is the anode of the red sub-pixel R and/or the anode of the blue sub-pixel B.

Figure 14:
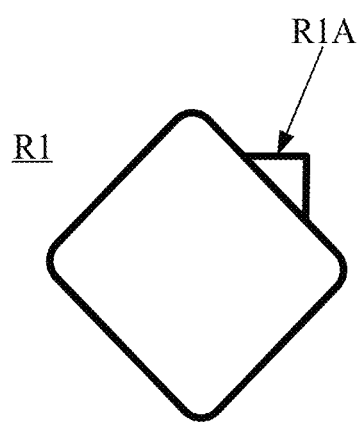
FIG. 14 is a schematic structural illustrating an anode of a target red sub-pixel in at least one embodiment of the present disclosure.

As shown in FIG. 14, in some optional embodiments, the anode of the red sub-pixel R is substantially rectangular, the red sub-pixel R includes a target red sub-pixel, the anode R1 of the target red sub-pixel further includes a protrusion R1A covering the compensation control transistor T2 in a direction away from the base substrate.

It can be understood that in the present embodiment, the area of the anode of the blue sub-pixel B is relatively large, so that the compensating control transistor T2 can be blocked directly with the anode of the blue sub-pixel B, whereas the size of the anode of the red sub-pixel R is relatively small, so that the structure of part or entirety of the anode of the red sub-pixel R can be adjusted, so as to realize that the anode of the red sub-pixel R can be used to shield the compensation control transistor T2.

In the present embodiment, the compensation control transistor T2 is blocked by using the anode of the blue sub-pixel B and the anode of the target red sub-pixel R to improve the stability of the compensation control transistor T2.

In some optional embodiments of the present disclosure, the display substrate further includes a third light shielding structure.

As shown in FIG. 2, which is a schematic structural diagram illustrating the active layer 210 in one embodiment of the present disclosure, in some embodiments of the present disclosure, the active layer 210 of the first reset transistor T1 includes a first semiconductor portion 211 and a second semiconductor portion 212 arranged at intervals, and a first conductor portion 213 coupled to the first semiconductor portion 211 and the second semiconductor portion 212, respectively, the first conductor portion 213 is covered by the third light shielding structure which includes the initialization signal line Vint.

As shown in FIG. 1 and FIG. 2, in the present embodiment, the first reset transistor is a dual-gate structure, and the active layer 210 of the first reset transistor includes a first semiconductor portion 211 and a second semiconductor portion 212 respectively corresponding to two gate metal layers, and a first conductor portion 213 located between the first semiconductor portion 211 and the second semiconductor portion 212. The first conductor portion 213 is shielded by the initialization signal line Vint.

It should be noted that the initialization signal line Vint here can be the initialization signal line Vint_n of the sub-pixel corresponding to the first reset transistor, and can also be the initialization signal lines corresponding to other sub-pixels, for example, the initialization signal line Vint_n−1 of a row of sub-pixels in the second direction (vertical direction in FIG. 9).

Further, as shown in FIG. 7, the first conductor portion 213 can be shielded by the power signal line VDD.

As shown in FIG. 1, in the present embodiment, the compensation control transistor T2 has a dual-gate structure, and the active layer 21 of the compensation control transistor T2 includes a third semiconductor portion 214 and a fourth semiconductor portion 215 corresponding to two gate metal layers, respectively, and a second conductor portion 216 located between the third semiconductor portion 214 and the fourth semiconductor portion 215.

In the present embodiment, the reliability of the compensation control transistor T2 is further improved by providing the shielding structure 232 to shield the second conductor portion 216.

As shown in FIG. 15 and FIG. 16, in some embodiments of the present disclosure, the first reset transistor T1 is at least partially covered by a second source-drain metal layer 260.

In the present embodiment, the second source-drain metal layer 260 can cover part or entirety of the first reset transistor T1. Referring to FIG. 15, the power compensation signal line 261 of the second source-drain metal layer 260 has a shielding area having a width L capable of covering at least a part of the first reset transistor T1.

It can be understood that when the width L of the shielding area is sufficiently large, and the first reset transistor T1 can be completely shielded, while the width L of the shielding area is small, a part of the first reset transistor T1 can be shielded.

The display device according to at least one embodiment of the present disclosure includes the above-mentioned display substrate.

A display device provided by at least one embodiment of the present disclosure may be any product or component having a display function such as a cell phone, a tablet computer, a television, a display, a notebook computer, a digital photo frame, a navigator, etc.

While the foregoing is directed to alternative embodiments of the present disclosure, it should be understood by those skilled in the art that various improvements and modifications may be made without departing from the principle of the present disclosure, and theses improvement and modifications shall fall within the scope of protection of the present disclosure.

What is claimed is:

1. A display substrate, comprising a base substrate, a drive circuit layer, a light-emitting layer and a touch layer arranged on the base substrate;
    wherein the drive circuit layer comprises at least a drive transistor, a first reset transistor, a compensation control transistor, and a reset control line, an initialization signal line, a switch control line, a light-emitting control signal line, a data signal line, and a power signal line; the drive transistor, the first reset transistor, and the compensation control transistor all comprise a control terminal, a first electrode and a second electrode; the light-emitting layer comprises a light-emitting element corresponding to each sub-pixel;
    the first electrode of the drive transistor is electrically connected to the power signal line, and the second electrode thereof is coupled to the corresponding light-emitting element;
    the control terminal of the first reset transistor is connected to the reset control line, the first electrode thereof is coupled to the initialization signal line, and the second electrode thereof is coupled to the control terminal of the drive transistor;
    the control terminal of the compensation control transistor is coupled to the switch control line, the first electrode thereof is coupled to the second electrode of the drive transistor, and the second electrode thereof is coupled to the control terminal of the drive transistor;
    the first reset transistor is at least partially covered by a first light shielding structure in a direction away from the base substrate, and the first reset transistor is at least partially covered by a second light shielding structure in a direction away from the base substrate, wherein the first light shielding structure and second light shielding structure are formed in different layers;
    wherein the first reset transistor is at least partially covered by a third light shielding structure which comprises the initialization signal line.

2. The display substrate of claim 1, wherein the first light shielding structure comprises the power signal line, wherein the second light shielding structure comprises an anode of the light-emitting layer or a metal line of the touch control layer.

3. The display substrate of claim 1, wherein an active layer of the first reset transistor comprises first and second semiconductor portions spaced apart, and first conductor portions coupled to the first and second semiconductor portions respectively; and
    the first conductor portions are covered by a third light shielding structure which comprises the initialization signal line.

4. The display substrate of claim 1, wherein the first light shielding structure shields one of the first electrode and the second electrode of the first reset transistor; and/or
    wherein the second light shielding structure shields the other of the first electrode and the second electrode of the first reset transistor.

5. The display substrate of claim 4, wherein the first light shielding structure shields the second electrode of the first reset transistor.

6. The display substrate of claim 4, wherein the second light shielding structure shields the first electrode of the first reset transistor.

7. The display substrate of claim 6, wherein the display substrate comprises green sub-pixels, the orthogonal projection of the first reset transistor on the base substrate overlaps the orthogonal projection of the green sub-pixels on the base substrate, and the second light shielding structure is an anode of the green sub-pixels.

8. The display substrate of claim 6, wherein the display substrate comprises the green sub-pixels, the orthogonal projection of the first reset transistor on the base substrate is located between the orthogonal projections of two adjacent green sub-pixels on the base substrate, and the second shading structure is the metal line of the touch control layer.

9. The display substrate of claim 8, wherein a width of the metal line of the touch control layer is greater in a portion between the two adjacent green sub-pixels than in a portion other than between the two adjacent green sub-pixels.

10. The display substrate of claim 1, wherein the drive circuit layer comprises an active layer, a first gate metal layer, a second gate metal layer, and a first source-drain metal layer; and
    the power signal line is located on the first source-drain metal layer; and
    at least a portion of the first conductor portion is shielded by the power signal line in a direction away from the base substrate.

11. The display substrate of claim 10, wherein the drive circuit layer further comprises a second source-drain metal layer; and
    the first reset transistor is at least partially covered by the second source-drain metal layer in a direction away from the base substrate.

12. The display substrate of claim 11, wherein the second source-drain metal layer comprises a power compensation signal line which has a shielding area corresponding to the first reset transistor; and
    at least part of the first reset transistor is covered by the reset control line in a direction away from the base substrate.

13. The display substrate of claim 1, wherein the active layer of the compensation control transistor comprises third and fourth semiconductor portions spaced apart, and second conductor portions coupled to the third and fourth semiconductor portions respectively; and
    the second conductor portion is covered by the second light shielding structure in a direction away from the base substrate.

14. The display substrate of claim 13, further comprising a shielding structure,
    wherein the drive circuit layer comprises an active layer, a first gate metal layer, a second gate metal layer, and a first source and drain metal layer; and
    the shielding structure is located on the second gate metal layer; and
    the second conductor portion is covered by the shielding structure in a direction away from the base substrate.

15. The display substrate of claim 1, wherein the display substrate comprises a red sub-pixel, the second light shielding structure comprises an anode of the red sub-pixel.

16. The display substrate of claim 15, wherein the red sub-pixel comprises a target red sub-pixel, the anode of the target red sub-pixel further comprises a protrusion in a direction away from the base substrate, and the protrusion covers one of the compensation control transistors.

17. The display substrate of claim 1, wherein the display substrate comprises a blue sub-pixel, the second light shielding structure comprises an anode of the blue sub-pixel.

18. The display substrate of claim 1, wherein an area of the first reset transistor covered by the first light shielding structure and an area covered by the second light shielding structure overlap.

19. The display substrate of claim 1, wherein an area of the first reset transistor covered by the first light shielding structure and an area covered by the second light shielding structure do not have an overlapping portion.

20. A display device, comprising a display substrate,
wherein the display substrate comprises a base substrate, a drive circuit layer, a light-emitting layer and a touch layer arranged on the base substrate;
wherein the drive circuit layer comprises at least a drive transistor, a first reset transistor, a compensation control transistor, and a reset control line, an initialization signal line, a switch control line, a light-emitting control signal line, a data signal line, and a power signal line; the drive transistor, the first reset transistor, and the compensation control transistor all comprise a control terminal, a first electrode and a second electrode; the light-emitting layer comprises a light-emitting element corresponding to each sub-pixel;
the first electrode of the drive transistor is electrically connected to the power signal line, and the second electrode thereof is coupled to the corresponding light-emitting element;
the control terminal of the first reset transistor is connected to the reset control line, the first electrode thereof is coupled to the initialization signal line, and the second electrode thereof is coupled to the control terminal of the drive transistor;
the control terminal of the compensation control transistor is coupled to the switch control line, the first electrode thereof is coupled to the second electrode of the drive transistor, and the second electrode thereof is coupled to the control terminal of the drive transistor;
the first reset transistor is at least partially covered by a first light shielding structure in a direction away from the base substrate, and the first reset transistor is at least partially covered by a second light shielding structure in a direction away from the base substrate, wherein the first light shielding structure and second light shielding structure are formed in different layers;
wherein the first reset transistor is at least partially covered by a third light shielding structure which comprises the initialization signal line.

* * * * *